(12) United States Patent
Baudot et al.

(10) Patent No.: US 11,107,941 B2
(45) Date of Patent: Aug. 31, 2021

(54) VERTICAL PHOTODIODE

(71) Applicant: STMicroelectronics (Crolles 2) SAS, Crolles (FR)

(72) Inventors: Charles Baudot, Lumbin (FR); Sebastien Cremer, Sassenage (FR); Nathalie Vulliet, Crolles (FR); Denis Pellissier-Tanon, Grenoble (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 16/292,525

(22) Filed: Mar. 5, 2019

(65) Prior Publication Data
US 2019/0280144 A1    Sep. 12, 2019

(30) Foreign Application Priority Data

Mar. 7, 2018 (FR) ...................... 1851988

(51) Int. Cl.
*H01L 31/105* (2006.01)
*H01L 31/0232* (2014.01)
*G02B 6/12* (2006.01)
*H01L 31/028* (2006.01)

(52) U.S. Cl.
CPC ........ *H01L 31/105* (2013.01); *G02B 6/12004* (2013.01); *H01L 31/028* (2013.01); *H01L 31/02327* (2013.01)

(58) Field of Classification Search
CPC .............. H01L 31/02327; H01L 31/028; H01L 31/105; G02B 6/12004
See application file for complete search history.

(56) References Cited

U.S. PATENT DOCUMENTS

| | | | | |
|---|---|---|---|---|
| 6,027,956 A | * | 2/2000 | Irissou | ................ H01L 31/0352 136/243 |
| 7,871,854 B1 | * | 1/2011 | Spencer | ................ H01L 31/105 438/97 |
| 2011/0037133 A1 | * | 2/2011 | Su | ....................... H01L 31/1808 257/432 |
| 2014/0138789 A1 | * | 5/2014 | Lim | .................... H01L 31/1812 257/458 |

(Continued)

FOREIGN PATENT DOCUMENTS

EP    2523026 A1    11/2012

OTHER PUBLICATIONS

Jifeng Liu: "Monolithically Integrated Ge-on-Si Active Photonics", Photonics, vol. 1, No. 3 , Jul. 2, 2014 (Jul. 2, 2014), pp. 162-197, XP055353773, DOI: 10.3390/photonics1030162 * abrégé ; figures 1(c), 1(d), 8(a), 8(b), 9; tableaux 1,2* *p. 162-p. 164 * *p. 174-pp. 189 *.

(Continued)

*Primary Examiner* — Sarah K Salerno
(74) *Attorney, Agent, or Firm* — Crowe & Dunlevy

(57) ABSTRACT

A vertical photodiode includes an active area. The contacting pads for the diode terminals are laterally shifted away from the active area so as to not be located above or below the active area. The active area is formed in a layer of semiconductor material by a lower portion of a germanium area that is intrinsic and an upper portion of the germanium area that is doped with a first conductivity type. The vertical photodiode is optically coupled to a waveguide formed in the layer of semiconductor material.

32 Claims, 3 Drawing Sheets

(56) References Cited

U.S. PATENT DOCUMENTS

2015/0236478 A1\* 8/2015 Huang .................... H01S 5/021
  372/45.01
2017/0062508 A1\* 3/2017 Na ........................ H01L 31/103

OTHER PUBLICATIONS

Reboud V et al: "Germanium based photonic components toward a full silicon/germanium photonic platform", Progress in Crystal Growth and Characterization of Materials, Elsevier Publishing, Barking, GB, vol. 63, No. 2 , May 20, 2017 (May 20, 2017), pp. 1-24, XP085042328, ISSN: 0960-8974, DOI: 10.1016/J.PCRYSGROW. 2017.04.004. \* le document en entier \*.

INPI Search Report and Written Opinion for FR 1851988 dated Jan. 11, 2019 (9 pages).

\* cited by examiner

VERTICAL PHOTODIODE

PRIORITY CLAIM

This application claims the priority benefit of French Application for Patent No. 1851988, filed on Mar. 7, 2018, the content of which is hereby incorporated by reference in its entirety to the maximum extent allowable by law.

TECHNICAL FIELD

The present disclosure relates to photonics, and more particularly to converters of light signals into electric signals or opto-electric converters.

BACKGROUND

Optical fibers enable to transfer data in the form of light signals, which are then converted into electric signals.

The speed of data transfer through an optical fiber is limited by the electro-optical converters (modulators of the optical carrier by an electric signal) and opto-electric converters (demodulators or photodetectors) respectively located upstream and downstream of the optical fiber.

SUMMARY

An embodiment provides a vertical photodiode comprising an active area having all its contacting areas shifted from above the active area.

According to an embodiment, the active area is formed of a lower intrinsic portion of a germanium area, an upper portion of the germanium area having a doping of a first conductivity type, the active area being formed in a layer of semiconductor material.

According to an embodiment, a lateral wall of the upper portion of the germanium area is in contact with a first doped region of a first conductivity type, the first region extending over the upper surface of the layer of semiconductor material.

According to an embodiment, the lower portion of the germanium area is in contact with a second doped region of a second conductivity type, the second region extending all the way to the upper surface of the layer of semiconductor material.

According to an embodiment, the contacting areas are located on the first and second regions, the first and second regions being preferably made of silicon.

According to an embodiment, the second region is partially made of SiGe.

According to an embodiment, the first and second regions each extend on one side of the intrinsic germanium area.

According to an embodiment, an insulating trench is at least partially in contact with a first lateral surface of the germanium area.

According to an embodiment, the portion of the first lateral surface which is not in contact with the insulating trench is in contact with intrinsic silicon.

According to an embodiment, the potential difference between the contacting areas of the photodiode is representative of the number of photons in the active area.

An embodiment provides an opto-electric converter comprising a photodiode such as previously described.

According to an embodiment, the converter comprises a waveguide.

An embodiment provides a method of manufacturing a vertical photodiode where all the contacting areas are shifted from above an active area.

According to an embodiment, the method comprises the steps of: opening a cavity in the upper surface of a layer of semiconductor material, preferably silicon; doping the layer of semiconductor material to form a first doped region of a first conductivity type on the upper surface of the layer of semiconductor material in contact with a lateral wall of the cavity and a second doped region of a second conductivity type in contact with the bottom of the cavity extending all the way to the surface of the layer of semiconductor material; forming intrinsic germanium in the cavity; and doping with the first conductivity type the upper portion of the intrinsic germanium in contact with the first region.

According to an embodiment, the contacting areas are formed on the first and second regions.

According to an embodiment, the method comprises a step of forming an insulating trench, extending parallel to the active area.

According to an embodiment, the cavity is opened so that one side of the cavity is at least partially formed by the insulating trench.

According to an embodiment, the cavity is opened so that three sides of the cavity area at least partially in contact with silicon.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
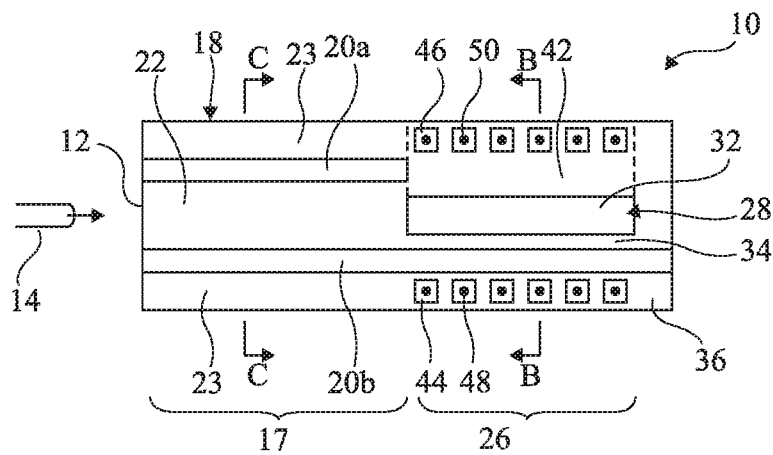
FIG. 1A is a top view illustrating an embodiment of a converter of light signals into electric signals.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings. The terms "approximately", "about", "substantially", and "in the order of" are used herein to designate a tolerance of plus or minus 10%, preferably of plus or minus 5%, of the value in question.

Figure 1B:
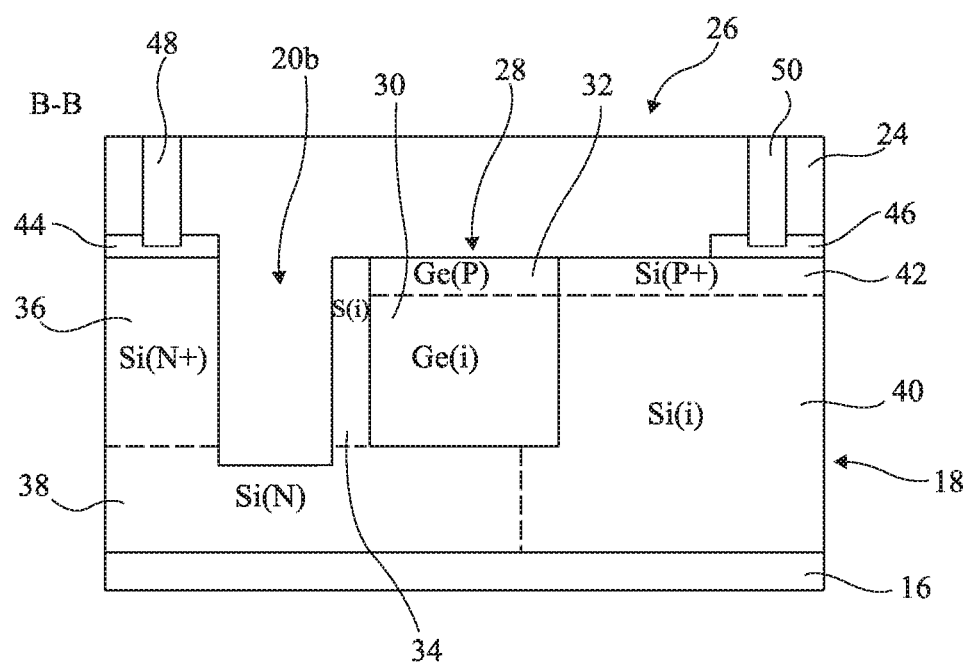
FIGS. 1B and 1C are cross-section views, respectively along plane B-B and along plane C-C of FIG. 1A.
Figure 1C:
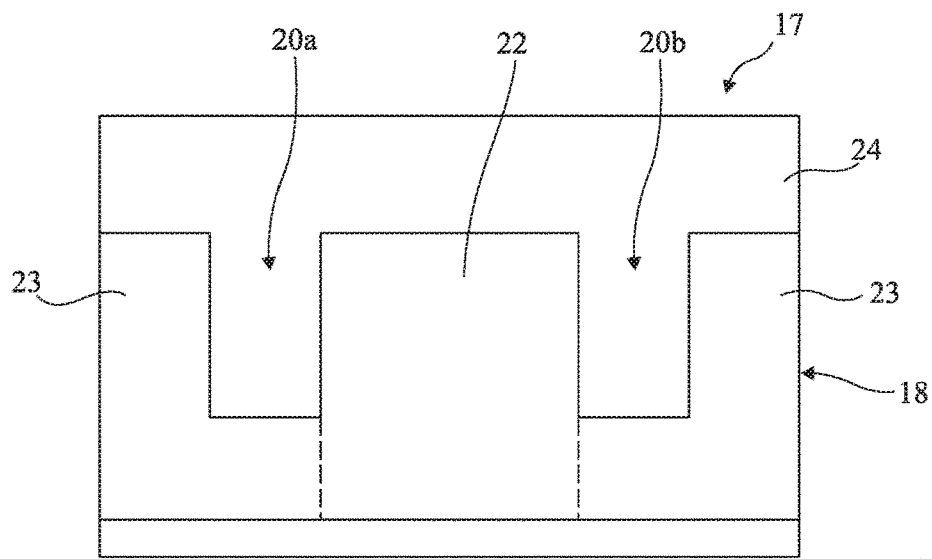

FIGS. 1A, 1B, and 1C respectively are a top view of an embodiment of a converter 10 of light signals into electric signals, a cross-section view along plane B-B of FIG. 1A, and a cross-section view along plane C-C of FIG. 1A.

Converter 10 receives a light signal at an input 12 from an optical fiber 14. Optical fiber 14 and converter 10 may, for example, be separated by an optical circuit having multiplexing functions, or a device capable of receiving and of transmitting the optical signal originating from the fiber. Converter 10 comprises a substrate, not shown, for example, made of silicon. The substrate is covered with a layer 16 of insulator (FIGS. 1B and 1C). Layer 16 is covered with a layer of semiconductor material 18, preferably silicon. Layer 18 is covered with a layer 24 of insulator, not shown in FIG. 1A.

The converter comprises a waveguide spindle 17. Waveguide 17 comprises two trenches 20a and 20b, filled with insulator, formed in layer 18. Trenches 20a and 20b delimit a region 22 (FIGS. 1A and 1C) located between the two trenches 20a and 20b, and regions 23 at the periphery. Each trench 20a and 20b is located between region 22 and a region 23. The height of trenches 20a and 20b is smaller than the thickness of layer 18.

Region 22 of waveguide 17 (FIG. 1A), horizontally delimited by trenches 20a and 20b and vertically delimited by layers 16 and 24, forms the region where the light signal propagates. Indeed, silicon is transparent for the considered wavelengths and the insulator of trenches 20a and 20b and of layers 16 and 24 is selected to have a refraction index sufficiently different from that of silicon to contain the light signal. For example, trenches 20a and 20b and layers 16 and 24 are made of silicon oxide, having a 1.45 refraction index, while that of silicon is 3.5.

Converter 10 further comprises a vertical photodiode 26 (FIGS. 1A and 1B). Vertical photodiode means a photodiode having its active area connected, via its upper and lower surfaces and conductive or semiconductor materials, to contacting areas.

Photodiode 26 comprises a germanium area 28 located opposite region 22 (FIG. 1A), on the path of the light signal. Area 28 is thus in the extension of region 22. Area 28 for example substantially has a parallelepiped shape. Area 28 comprises, as shown in FIG. 1B, a lower intrinsic germanium portion 30 (Ge(i)) and an upper doped germanium portion 32 (Ge(P)). In the example of FIGS. 1A, 1B, and 1C, the germanium of upper portion 32 is P-type doped. Lower portion 30 forms the active area of photodiode 26.

Trench 20b extends along area 28, parallel thereto. Trench 20a only extends in waveguide 17 and does not extend at the level of the photodiode.

In the cross-section plane shown in FIG. 1B, the upper surface of area 28 is in contact with insulator layer 24 and the three other surfaces are in contact with the silicon of layer 18. One of the lateral surfaces (on the left-hand side of FIG. 1B) is separated from trench 20b by an intrinsic silicon region 34 (Si(i)). Trench 20b separates region 34 from a doped silicon region 36 (Si(N+)) of a type opposite to the type of upper portion 32. In this example, region 36 is N-type doped. Region 36 is in the extension of one of regions 23 of waveguide 17. The lower surface of area 28 is in contact with a region 38 (Si(N)) separating area 28 from layer 16 and extending from area 28 to region 36. Region 38 has the same doping type as region 36 (here, N) and is for example less heavily doped than region 36. The other lateral surface of area 28 (on the right-hand side of FIG. 1B) is in contact, at the level of lower portion 30, with an intrinsic silicon region 40 (Si(i)) and, at the level of upper portion 32, with a doped silicon region 42 (Si(P+)) of the same conductivity type as upper portion 32 (here, P). Region 42 is for example more heavily doped than upper portion 32. Region 42 extends over the surface of layer 18, more particularly over region 40.

The doping concentration of upper portion 32 is, for example, in the range from approximately $10^{18}$ cm$^{-3}$ to approximately $10^{19}$ cm$^{-3}$. The doping concentration of regions 36, 38, and 42 is, for example, in the range from approximately $10^{18}$ to approximately $10^{20}$ cm$^{-3}$.

Contacting areas of the photodiode are formed on region 36 and on region 42. More particularly, contact pads 44 are formed on region 36 and contact pads 46 are formed on region 42. Vias 48 and 50 cross insulator layer 24 to respectively reach pads 44 and pads 46. The contacting areas of the photodiode are thus all shifted laterally from (i.e., are not located above) the active area 30.

Thus, the lower surface of active area 30 is electrically connected to via 48 via an N-type doped semiconductor region (regions 36 and 38) extending all the way to the surface of layer 18 and the upper surface of active area 30 is electrically connected to via 50 via a P-type doped semiconductor region (portion 32 and region 42).

A light signal supplied by optical fiber 14 to input 12 can propagate through waveguide 17 to reach photodiode 26, more particularly lower portion 30 of area 28. Lower intrinsic germanium portion 30 then creates charge carriers when the light signal reaches it. Thus, the voltage measured between regions 36 and portion 32 (via vias 48 and 50) is representative of the data transmitted by the light signal. More particularly, the potential difference between the contacting areas of the photodiode is representative of the number of photons in the active area, and thus of the light signal reaching the photodiode.

The refraction index difference between germanium (4.5) and intrinsic silicon (3.5) is sufficient to confine the signal in the active area for the time necessary to transmit the message.

As a variation, lower portion 30 of area 28 may be separated from region 38 by a silicon-germanium layer (SiGe), not shown, doped with the same conductivity type as region 38 (here, N).

Area 28 for example has a width, in the cross-section plane of FIG. 1B, in the range from approximately 500 to approximately 1,200 nm, preferably from 500 to 1,200 nm. Intrinsic germanium portion 30 has a thickness for example in the range from approximately 150 to approximately 500 nm, preferably from 150 to 500 nm. Upper doped germanium portion 32 for example has a thickness in the range from approximately 50 to approximately 100 nm, preferably from 50 to 200 nm. Trench 20b has, in the cross-section plane of FIG. 1B, a width for example in the range from approximately 400 to approximately 800 nm, preferably from 600 to 800 nm. Area 28 and contact pad 46 are spaced apart by a distance for example in the range from approximately 400 to approximately 800 nm, preferably from 400 to 800 nm.

It could have been chosen to form contact pads 46 and vias 50 directly on upper portion 32 of area 28. However, manufacturing inaccuracies might have caused the forming of vias 50 partially extending in portion 32. The portion of vias 50 extending in the germanium of portion 32 would then absorb a portion of the light signal which would then be lost. Further, the manufacturing of pads on two different materials is constraining in terms of manufacturing process.

An advantage of the embodiment of FIGS. 1A to 1C is that a manufacturing inaccuracy at the level of vias 50 could at most generate an extension of via 50 all to the way to region 42, but not in area 28. Thus, via 50 would then not be on the path of the light signal.

Figure 2A:
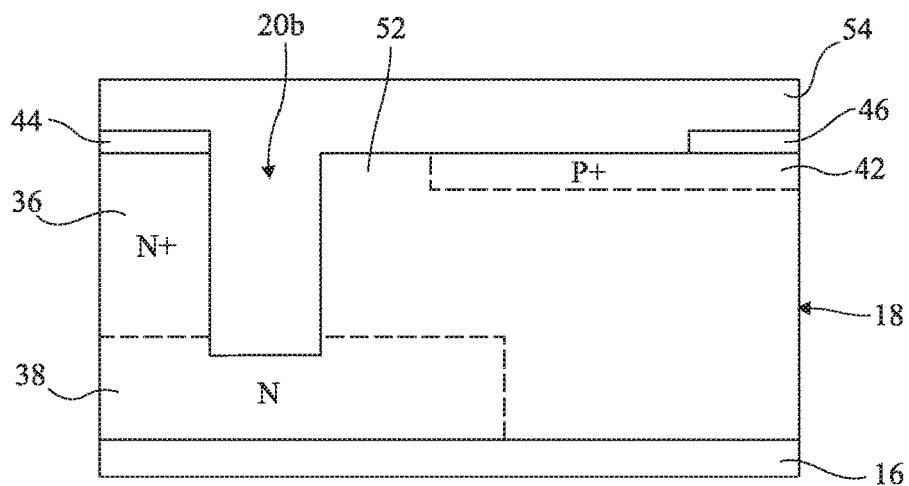
FIGS. 2A to 2C are cross-section views illustrating manufacturing steps of the embodiment of FIGS. 1A to 1C.
Figure 2B:
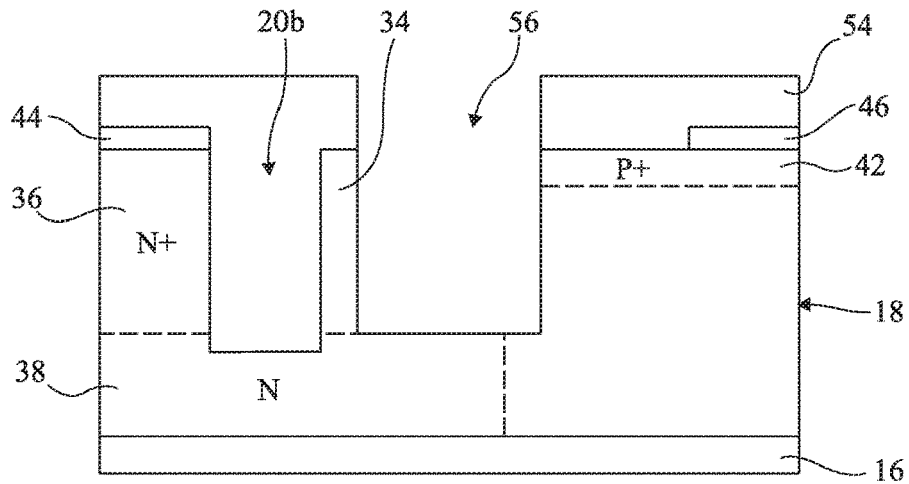
Figure 2C:
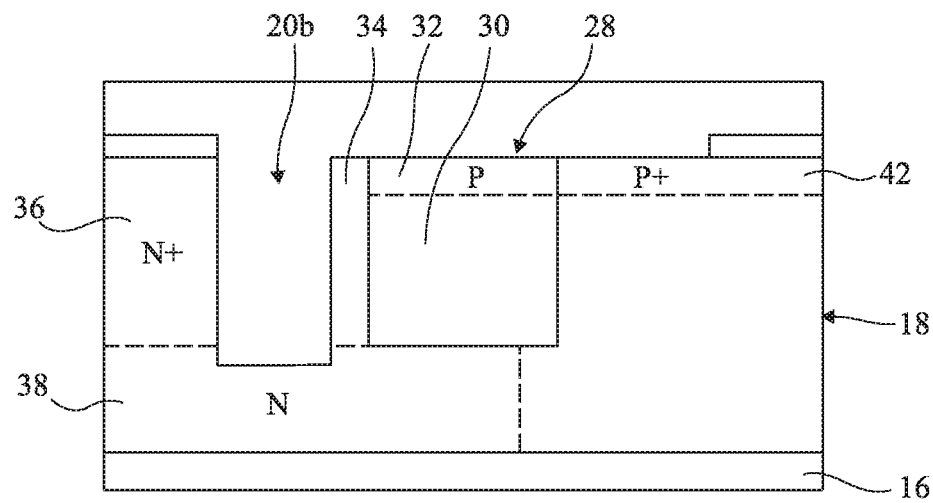

FIGS. 2A to 2C are cross-section views illustrating manufacturing steps of the embodiment of FIGS. 1A and 1B.

FIG. 2A illustrates a manufacturing step. During this step, insulating layer 16 is formed on a substrate, not shown.

Layer 18 of semiconductor material, preferably made of intrinsic silicon, is then formed on layer 16. Trenches 20a and 20b are formed in layer 18. Trench 20b extends over the entire opto electric converter 10 (waveguide and photodiode) and trench 20a, not shown in FIGS. 2A to 2C, extends all the way to the location where the photodiode will be formed. The waveguide where the light signal will propagate from the optical fiber to the photodiode is thus formed between trenches 20a and 20b. The plane of the cross section of FIG. 2A is located in the portion where the photodiode will be located. Only trench 20b is thus shown.

Trench 20b shown in FIG. 2A separates a region 52 from region 36. Region 52 is located at the surface of the end of the waveguide, not shown.

Doping operations are then performed. In particular, region 36 is N-type doped (N+), and region 38 located under region 52, under trench 20b and under region 36, is also N-type doped. Region 38 is less heavily doped than region 36. Region 42, located at the surface of layer 18 and extending from the periphery of layer 18 (on the right-hand side in FIG. 2A) all the way to region 52 and partially over region 52, is P-type doped (P+).

Contact pads 44 and 46 are then formed, respectively, on regions 36 and 42.

A layer 54 of insulator is deposited on the described structure, to fill trenches 20a and 20b and to cover layer 18 and pads 44 and 46. Layer 54 is for example made of the same insulator as layer 16, for example, of silicon oxide.

FIG. 2B illustrates a subsequent manufacturing step. During this step, a cavity 56 is formed in layer 54 and in region 52.

Cavity 56 is sufficiently deep for the bottom of cavity 56 to be located in region 38. Further, cavity 56 is located in such a way that region 42 forms a portion of a lateral wall of cavity 56. In the example of FIGS. 2A to 2C, cavity 56 is located in such a way that intrinsic silicon region 34 separates the cavity from trench 20b.

FIG. 2C illustrates a subsequent manufacturing step. During this step, germanium is formed in cavity 56 by epitaxial growth, to form area 28, totally filling the portion of cavity 56 located in layer 18. The germanium may optionally fill the entire cavity 56. In the cross-section plane of FIG. 2C, the germanium is formed on three walls.

Upper portion 32 of area 28 is then P-type doped. Lower intrinsic portion 30 forms the active area.

The structure is covered again with insulator, for example, the same insulator as layer 16, for example, silicon oxide, to form previously-described layer 24.

During a subsequent step, not shown, vias 48 and 50 are formed through layer 24.

As a variation, a step, not shown, of forming an N-type doped SiGe layer at the bottom of cavity 56 may also be present.

Figure 3:
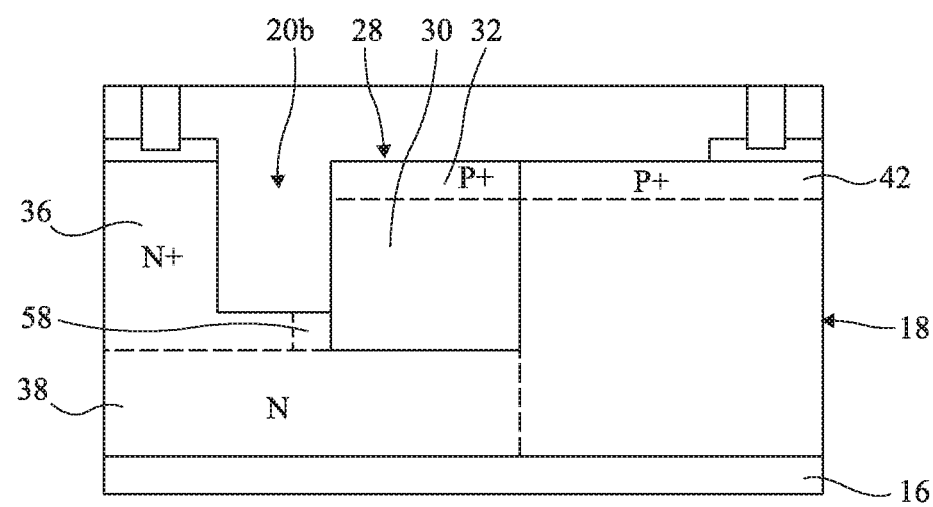
FIG. 3 is a cross-section view illustrating another embodiment of a converter of light signals into electric signals.

FIG. 3 is a cross-section view illustrating another embodiment of a converter of light signals into electric signals. In this embodiment, cavity 56 is dug in such a way that one of the walls of the cavity is partially formed by trench 20b. Further, the height of trench 20b is lower than that of trench 20b of the embodiment of FIGS. 2A to 2C.

Thus, the wall of active area 30 located on the side of trench 20b is partially in contact with trench 20b and partially in contact with a region 58. Region 58 is made of the material of layer 18, preferably of intrinsic silicon. Region 58 has a small height as compared with the height of germanium area 28.

As a variation, trench 20b could have a thickness greater than the height of silicon area 28. Thus, the wall of area 28 located on the side of trench 20b would be entirely in contact with trench 20b. Thus, in the cross-section plane of FIG. 3, the germanium of area 28 would have formed on two walls only.

During the epitaxial growth step, the forming on two walls of cavity 56 (in the cross-section plane of FIG. 3), and possibly on region 58, of a small height of the germanium enables to decrease the number of dislocations in the germanium, causing losses at the level of the transmitted signals, as compared with the embodiment of FIG. 1B. However, the germanium growth is then longer than in the embodiment of FIG. 1B.

The frequency of converter 10 is dependent on the resistance between the active area and the contacting areas and on the capacity of the active area between region 38 (N doped) and region 32 (P doped). The lower the capacity and the resistance, the higher the frequency.

An advantage of such an embodiment is that it is possible for the active area to have a small thickness, and thus a small capacitance, while keeping a sufficient width for the dislocations forming during the epitaxial growth of germanium to be at the periphery of area 28. It is thus possible to increase the frequency of such a converter with respect to usual converters, which authorizes an increase in the flow rate with respect to current technologies which allow a transfer speed of approximately 25 Gbps (Gigabits per second).

The height of trench 20b is, for example, in the range from approximately half the thickness of layer 18 to approximately five sixths of the thickness of layer 18. The thickness of layer 18 is for example approximately equal to 300 nm, preferably equal to 300 nm, and the height of trench 20b is for example in the range from approximately 50 to approximately 150 nm, preferably in the range from 50 to 150 nm.

The selection of the depth of trench 20b enables to modify the resistance between the active area and some of the contacting areas, which also enables to modify the converter frequency.

Specific embodiments have been described. Various alterations, modifications, and improvements will readily occur to those skilled in the art. In particular, the P and N conductivity types may be exchanged.

As a specific embodiment, the described converter is adapted to a light signal for example having a 1,310-nm wavelength or a 1,550-nm wavelength.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A vertical photodiode, comprising:
   a layer of semiconductor material having an upper surface;
   an active area within the layer of semiconductor material forming a diode, said active area having a germanium area with a lower portion that is intrinsic and an upper portion that is doped with a first conductivity type;
   a first doped region of the first conductivity type within the layer of semiconductor material and extending at the upper surface of the layer of semiconductor material, wherein said first doped region is in direct physical contact with a lateral wall of the upper portion of the germanium area;

a second doped region of a second conductivity within the layer of semiconductor material, wherein the second doped region is in direct physical contact with the lower portion of the germanium area, the second doped region extending from the lower portion of the germanium area to the upper surface of the layer of semiconductor material; and first and second contact pads electrically coupled to the diode, wherein the first and second contact pads are located at positions which are laterally shifted away from the active area; and wherein said first contact pad is in direct physical contact with the first doped region at the upper surface of the layer of semiconductor material; and wherein said second contact pad is located in direct physical contact with the second doped region at the upper surface of the layer of semiconductor material.

2. The photodiode of claim 1, wherein a portion of the first doped region not covered by said first contact pad is located between the active area and the first contact pad.

3. The photodiode of claim 1, wherein the first and second doped regions are made of silicon.

4. The photodiode of claim 1, wherein the second doped region is partially made of SiGe.

5. The photodiode of claim 1, wherein the second doped region includes a portion that is located at an opposite side of the intrinsic germanium area from the first doped region.

6. The photodiode of claim 1, further comprising an insulating trench extending into the layer of semiconductor material, wherein said insulating trench is at least partially in contact with a lateral surface of the germanium area, said insulating trench separating the active area from the second contact pad.

7. The photodiode of claim 6, wherein a portion of the lateral surface which is not in contact with the insulating trench is in contact with intrinsic silicon.

8. The photodiode of claim 1, wherein a potential difference between the first and second contact pads is representative of the number of photons in the active area.

9. An opto-electric converter including a vertical photodiode as recited in claim 1.

10. The converter of claim 9, further comprising an optical waveguide coupled to the vertical photodiode.

11. The photodiode of claim 1, further comprising:
an insulating trench in the layer of semiconductor material that separates the active area from the second contact pad; and
an intrinsic silicon region between the active area and the insulating trench.

12. A vertical photodiode, comprising:
a layer of semiconductor material having an upper surface;
an insulating trench extending from the upper surface into the layer of semiconductor material;
an active area within the layer of semiconductor material at a first side of the insulating trench, the active area including a diode formed by: a germanium area including a lower portion that is intrinsic and an upper portion that is doped with a first conductivity type and a doped region of a second conductivity type;
wherein the doped region of the second conductivity type extends under the insulating trench;
a first doped contact region of the first conductivity type laterally contacting the upper portion of the germanium area, the first doped contact region extending over the upper surface of the layer of semiconductor material;
a first contact pad located in contact with the first doped contact region;
a second doped contact region of the second conductivity type in contact with the doped region of the second conductivity type, the second doped contact region extending at a second side of the trench opposite the first side; and
a second contact pad located in contact with the second doped contact region at the upper surface of the layer of semiconductor material.

13. The photodiode of claim 12, wherein there is a portion of the first doped contact region that is not in contact with the first contact pad that is located between the upper portion of the germanium area and the first contact pad.

14. The photodiode of claim 12, wherein the first and second doped contact regions are made of silicon.

15. The photodiode of claim 12, wherein the second doped contact region is at least partially made of silicon-germanium.

16. The photodiode of claim 12, wherein a depth of the insulating trench is below a bottom of the lower portion of the germanium area.

17. The photodiode of claim 12, further including an intrinsic silicon region positioned between the germanium area and the first side of the insulating trench.

18. The photodiode of claim 12, further including an intrinsic silicon region in contact with both the lower portion of the germanium area and the doped region of the second conductivity type.

19. The photodiode of claim 12, wherein the doped region of the second conductivity type is made of silicon.

20. The photodiode of claim 12, wherein the doped region of the second conductivity type is at least partially made of silicon-germanium.

21. A vertical photodiode, comprising:
an active area including a diode;
wherein the active area is formed in a layer of semiconductor material by a lower portion of a germanium area that is intrinsic and an upper portion of the germanium area that is doped with a first conductivity type;
first and second contact pads electrically coupled to the diode, wherein the first and second contact pads are located at positions which are laterally shifted away from the active area;
an insulating trench separating the active area from the second contact pad; and
an intrinsic silicon region between the active area and the insulating trench.

22. The photodiode of claim 21, further comprising a first doped region of the first conductivity type in the layer of semiconductor material, wherein the first doped region is in contact with a lateral wall of the upper portion of the germanium area, and wherein said first contact pad is located in contact with an upper surface of the first doped region.

23. The photodiode of claim 22, wherein a portion of the first doped region not covered by said first contact pad is located between the active region and the first contact pad.

24. The photodiode of claim 22, further comprising a second doped region of a second conductivity type in said layer of semiconductor material, wherein the second doped region is in contact with the lower portion of the germanium area, and wherein said second contact pad is located in contact with an upper surface of the second doped region.

25. The photodiode of claim 24, wherein the first and second doped regions are made of silicon.

26. The photodiode of claim 24, wherein the second doped region is partially made of SiGe.

27. The photodiode of claim 24, wherein the second doped region includes a portion that is located at an opposite side of the intrinsic germanium area from the first doped region.

28. The photodiode of claim 21, wherein the insulating trench is at least partially in contact with a first lateral surface of the germanium area.

29. The photodiode of claim 21, wherein a portion of the first lateral surface which is not in contact with the insulating trench is in contact with intrinsic silicon.

30. The photodiode of claim 21, wherein a potential difference between the first and second contact pads is representative of the number of photons in the active area.

31. An opto-electric converter including with a vertical photodiode as recited in claim 21.

32. The converter of claim 31, further comprising an optical waveguide coupled to the vertical photodiode.

* * * * *